United States Patent
Shimomura et al.

[11] Patent Number: 5,956,270
[45] Date of Patent: Sep. 21, 1999

[54] FLASH MEMORY AND MICROCOMPUTER

[75] Inventors: Takehiko Shimomura; Nobusuke Abe, both of Tokyo, Japan

[73] Assignee: Mitsubishi Denki Kabushiki Kaisha, Tokyo, Japan

[21] Appl. No.: 08/911,073

[22] Filed: Aug. 14, 1997

[30] Foreign Application Priority Data

Mar. 26, 1997 [JP] Japan ................................. 9-074076

[51] Int. Cl.$^6$ .............................. G11C 16/04; G11C 7/00
[52] U.S. Cl. ................................ 365/185.18; 365/185.33; 365/226
[58] Field of Search ........................ 365/185.18, 185.22, 365/185.24, 185.26, 185.29, 185.33, 218, 226

[56] References Cited

U.S. PATENT DOCUMENTS

| | | | |
|---|---|---|---|
| 5,301,161 | 4/1994 | Landgraf et al. | 365/226 |
| 5,471,518 | 11/1995 | Barber et al. | 365/218 |
| 5,542,082 | 7/1996 | Solhjell | 395/442 |
| 5,694,360 | 12/1997 | Iizuka et al. | 365/185.33 |
| 5,724,289 | 3/1998 | Watanabe | 365/185.33 |

FOREIGN PATENT DOCUMENTS

| | | |
|---|---|---|
| 63-168896 | 7/1988 | Japan . |
| 2-143553 | 6/1990 | Japan . |
| 6-69407 | 3/1994 | Japan . |

*Primary Examiner*—David Nelms
*Assistant Examiner*—Trong Phan
*Attorney, Agent, or Firm*—Burns, Doane, Swecker & Mathis, LLP

[57] ABSTRACT

A flash memory comprising a power supply controller and a second controller, as well as a microcomputer incorporating the flash memory. A power supply terminal of the power supply controller is furnished separately from a power supply terminal of those circuits in the second controller which operate on the same supply voltage as the power supply controller, whereby controlled voltages and ground potential are stabilized for the memory and microcomputer.

8 Claims, 3 Drawing Sheets

FIG.1
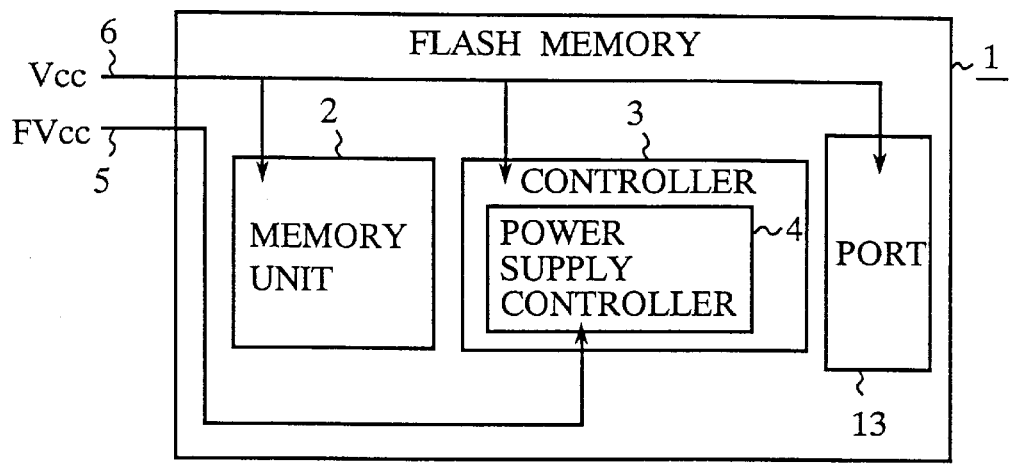
FIG.2 (1)
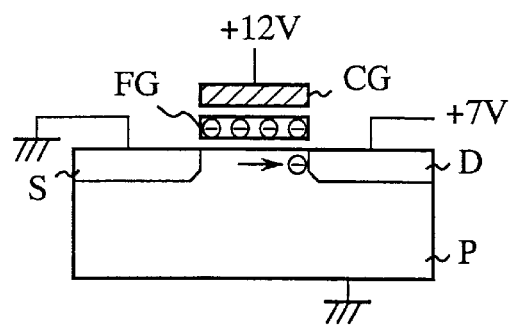
FIG.2 (3)
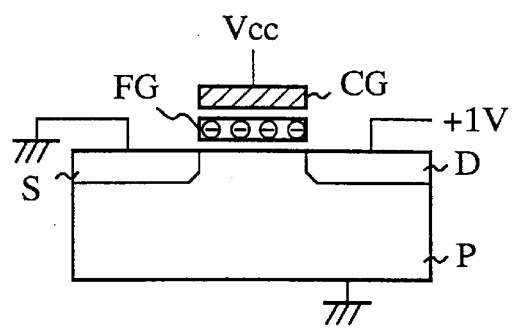
FIG.2 (2)
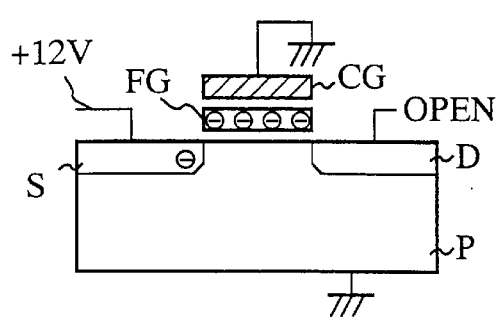
FIG.2 (4)
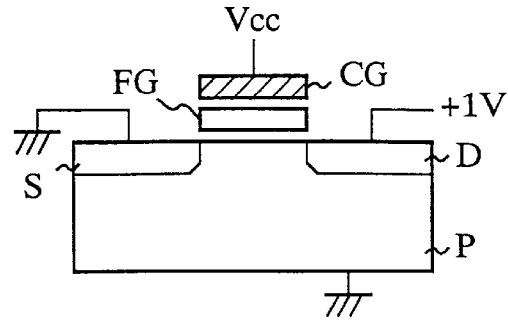

FLASH MEMORY AND MICROCOMPUTER

BACKGROUND OF THE INVENTION

1. Field of the Invention

The present invention relates to a flash memory with a power supply controller and a second controller for other control purposes as well as to a microcomputer incorporating such a flash memory, the power supply controller controlling voltages applied to the memory for data write, erase or verify operations thereon, wherein the power supply controller and at least part of the circuits in the second controller operate from the same supply voltage.

2. Description of the Prior Art

FIG. 6 schematically illustrates a conventional flash memory that operates from a single power supply. In FIG. 6, reference numeral 61 stands for a flash memory; 62 for a memory unit having memory devices arranged therein; 63 for a controller that controls the memory unit 62 in operation; 64 for a power supply controller that controls voltages applied to the memory unit 62 for data write, erase or verify operations thereon; 66 for a power supply (marked VCC hereunder) that supplies power to the memory unit 62, controller 63, power supply controller 64 and a port 73; 68 for a grounded circuit (marked VSS hereunder) covering the memory unit 62, controller 63, power supply controller 64 and port 73; and 73 for the port for exchanging data with an external circuit.

In the conventional flash memory 61, the VCC 66 acts as a common power supply that powers the memory unit 62, controller 63, power supply controller 64 and port 73. The VCC 66 is used by a step-up/step-down circuit in the power supply controller 64 to generate voltages for data write, erase or verify operations on the flash memory 61. The VSS 68 works as a common grounded circuit shared by the memory unit 62, controller 63, power supply controller 64 and port 73.

In the conventional flash memory controlled voltages generated by the power supply controller for data write, erase or verify operations on the memory unit are liable to be affected by operations of other control circuits in the controller. This makes it difficult to supply voltages and often leaves the ground potential unstable. Possible negative consequences include: a reduced write voltage prolonging the time it takes to write data to the flash memory; a lowered erase voltage prolonging the time required to erase data from the flash memory; a raised write or erase voltage destroying the flash memory; and a fluctuating verify voltage nullifying the verification of whether data is written to or erased from the flash memory correctly.

Microcomputers incorporating the above kind of flash memory are vulnerable to the memory-related irregularities listed above. In such microcomputers, the CPU may take more time to write and erase data to and from the flash memory or may otherwise develop memory-related malfunction.

SUMMARY OF THE INVENTION

It is therefore a primary object of the present invention to provide a flash memory allowing data write, erase and verify operations performed thereon in a stable manner with a reduced possibility of memory device destruction.

It is another object of the present invention to provide a microcomputer wherein data write and erase operations to and from a disabled flash memory are not affected by fluctuations in speed of the CPU or other memory-related irregularities.

In carrying out the invention and according to a first aspect thereof, there is provided a flash memory wherein the power supply terminal of a power supply controller is furnished separately from a power supply terminal of those circuits in a second controller which operate on the same supply voltage as the power supply controller. When thus constituted, the flash memory helps stabilize data write, erase and verify operations performed thereon. The arrangement also contributes to easing conventional requirements on power supplies regarding power supply terminals, whereby design work on the power supply section of the circuit board is facilitated.

According to a second aspect of the invention, there is provided a flash memory wherein a power supply terminal of a power supply controller and of those circuits in a second controller which operate on the same supply voltage as the power supply controller and which do not perform switching actions likely to trigger a significant power fluctuation is furnished separately from a power supply terminal of those circuits in the second controller which operate on the same supply voltage as the power supply controller and which perform switching actions likely to trigger a significant power fluctuation. The flash memory thus structured offers a higher degree of design freedom than before.

According to a third aspect of the invention, there is provided a flash memory wherein a ground terminal of a power supply controller is furnished separately from a ground terminal of those circuits in a second controller which are likely to trigger a significant ground potential fluctuation. The flash memory according to this embodiment helps stabilize ground potential used upon data write, erase or verify operations performed on the memory.

According to a fourth aspect of the invention, there is provided a flash memory wherein a ground terminal of a power supply controller and of those circuits in a second controller which do not perform switching actions likely to trigger a significant ground potential fluctuation is furnished separately from a ground terminal of those circuits in the second controller which perform switching actions likely to trigger a significant ground potential fluctuation. The flash memory of this structure offers an even higher degree of design freedom than before.

According to a fifth aspect of the invention, there is provided a microcomputer having a flash memory wherein a power supply terminal of a power supply controller is furnished separately from a power supply terminal of those circuits in a second controller which operate on the same supply voltage as the power supply controller. With this microcomputer, data write, erase and verify operations performed on the flash memory are stabilized. The arrangement of the flash memory also contributes to easing conventional requirements on power supplies regarding power supply terminals, whereby design work on the power supply section of the circuit board is facilitated.

According to a sixth aspect of the invention, there is provided a microcomputer having a flash memory wherein a power supply terminal of a power supply controller and of those circuits in a second controller which operate on the same supply voltage as the power supply controller and which do not perform switching actions likely to trigger a significant power fluctuation is furnished separately from a power supply terminal of those circuits in the second controller which operate on the same supply voltage as the power supply controller and which perform switching actions likely to trigger a significant power fluctuation. The microcomputer comprising this kind of flash memory permits a higher degree of design freedom than before.

According to a seventh aspect of the invention, there is provided a microcomputer having a flash memory wherein a ground terminal of a power supply controller is furnished separately from a ground terminal of those circuits in a second controller which are likely to trigger a significant ground potential fluctuation. With this microcomputer, the ground potential used for data write, erase and verify operations on the flash memory is stabilized.

According to an eighth aspect of the invention, there is provided a microcomputer having a flash memory wherein a ground terminal of a power supply controller and of those circuits in a second controller which do not perform switching actions likely to trigger a significant ground potential fluctuation is furnished separately from a ground terminal of those circuits in the second controller which perform switching actions likely to trigger a significant ground potential fluctuation. The microcomputer using a flash memory of this type permits a still higher degree of design freedom than before.

BRIEF DESCRIPTION OF THE DRAWINGS

Further objects and advantages of this invention will become apparent upon a reading of the following description and appended drawings in which:

FIG. 1 is a schematic view of a flash memory practiced as a first embodiment of the invention;

FIGS. 2(1) through 2(4) are sectional views showing how memory devices of the first embodiment work;

DETAILED DESCRIPTION OF THE PREFERRED EMBODIMENTS

Figure 3:
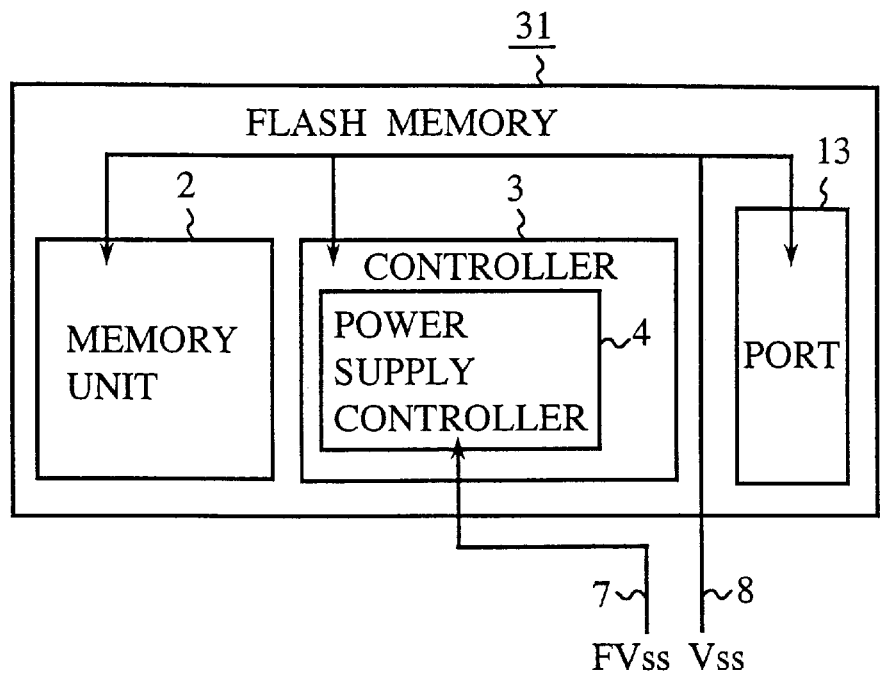
FIG. 3 is a schematic view of a flash memory practiced as a second embodiment of the invention.

Preferred embodiments of this invention will now be described with reference to the accompanying drawings.

First Embodiment

FIG. 1 is a schematic view of a flash memory practiced as the first embodiment of the invention and operating from a single power supply. In FIG. 1, reference numeral 1 stands for a flash memory; 2 for a memory unit having memory devices arranged therein; 3 for a controller that controls the memory unit 2 in operation; 4 for a power supply controller that controls voltages applied to the memory unit 2 for data write, erase or verify operations thereon; 5 for a power supply (marked FVCC hereunder) that supplies power to the power supply controller 4 for data write, erase or verify operations on the memory unit 2; 6 for a power supply (marked VCC hereunder) that supplies power to the memory unit 2, controller 3 and a port 13; and 13 for the port for exchanging data with an external circuit. The power supply terminal of the FVCC 5 and that of the VCC are separately furnished.

The VCC 6 connected to the memory unit 2 supplies power not only to sense amplifiers therein but also to control gates of memory devices in the memory unit 2 upon data read operations. During data read operations, controlled voltages to those electrodes of memory devices in the memory 2 other than the control gates are supplied from the power supply controller 4 via lines not shown. The controller 3 includes circuits such as a clock generator performing switching actions, while the power supply controller 4 has no circuits executing switching actions.

How the first embodiment works will now be described. When data is to be written to a memory device in the memory unit 2, a step-up circuit (not shown) inside the power supply controller 4 boosts the supply voltage of the FVCC 5. As shown in FIG. 2(1), high voltages are applied to a control gate CG and to a drain D of the memory device (e.g., 12V to the control gate CG and 7V to the drain D) while a source S is connected to ground. This brings about an avalanche breakdown near the drain D generating hot electrons that are injected to a floating gate FG to write data. In FIGS. 2(1) through 2(4), reference character P denotes a P-type substrate.

When erasing data from a memory device, the step-up circuit applies a high voltage (12V) to the source S while the control gate CG is connected to ground and the drain D is left open, as shown in FIG. 2(2). This precipitates extraction of electrons from the device through the tunnel effect, whereby data is erased.

When data is to be read from a memory device that stores data, the following takes place: the source S is connected to ground, the drain D is fed with a lowered voltage (1V) from a step-down circuit in the power supply controller 4, and the control gate CG is supplied with the supply voltage from the VCC 6, as illustrated in FIG. 2(3). Because electrons fed to the floating gate FG have raised the threshold voltage of this memory device transistor, the memory device is not turned on and no current flows to the bit line. This state is detected by the corresponding sense amplifier and interpreted thereby as a "0" state representing the presence of data in the memory device.

Where data is to be read from a memory device having no data stored therein, applying the VCC to the control gate turns on the memory device and allows a current to flow to the bit line, as depicted in FIG. 2(4). This current is detected by the applicable sense amplifier and interpreted thereby as a "1" state signifying the absence of data.

For a verify operation, the above-described read operation is carried out to see if data has been correctly written to or erased from the memory device in question.

As described, the flash memory 1 operating from a single power supply comprises the power supply controller 4 having step-up and step-down circuits to control voltages for use in data write, erase and verify operations performed on memory devices. A fluctuation in the supply voltage to the power supply controller 4 will vary voltages fed from the step-up/step-down circuit to electrodes of each memory device, causing diverse irregularities which are to be averted by this invention. With the first embodiment, the power supply terminal of the FVCC 5 to the power supply controller 4 including no circuits performing switching actions liable to precipitate a large power fluctuation is provided separately from the power supply terminal of the VCC 6 to the controller 3 comprising circuits executing such switching actions. This keeps fluctuations in the supply voltage of the power supply controller 4 to a minimum.

The first embodiment allows the power supply controller 4 to feed stable voltages to the electrodes of memory devices in the manner described above. This keeps the flash memory 1 stabilized in its operation.

Although the first embodiment has the FVCC 5 fed only to the power supply controller 4, the FVCC 5 may also be used to power circuits which do not perform switching actions liable to trigger a large power fluctuation. In the latter case, the FVCC 5 acts as a power supply both to the power supply controller 4 and to those circuits in the controller 3 which are not liable to precipitate a power fluctuation. The other circuits in the controller 3 are then powered by the VCC 6.

Although the first embodiment is a flash memory operating from a single power supply, this is not limitative of the invention. That is, the invention may also be applied to a flash memory operating from a plurality of power supplies. More specifically, the invention may be practiced as a flash memory wherein the power supply terminal of a power supply controller is furnished separately from the power supply terminal of those control circuits in a second controller which operate on the same supply voltage as the power supply controller and which are liable to precipitate a large power fluctuation.

Second Embodiment

FIG. 3 is a schematic view of a flash memory practiced as the second embodiment of the invention and operating from a single power supply. Of the reference numerals in FIG. 3, those already used in FIG. 1 for the first embodiment designate like or corresponding parts, and descriptions of such parts are omitted where repetitive.

In FIG. 3, reference numeral 31 stands for a flash memory; 7 for a grounded circuit (marked FVSS hereunder) for the power supply controller 4; and 8 for a grounded circuit (marked VSS hereunder) for the components other than the power supply controller in the flash memory 31. The ground terminal of the FVSS 7 is furnished separately from the ground terminal of the VSS 8.

How the second embodiment works will now be described. The second embodiment is characterized by the ground terminal of the FVSS 7 and that of the VSS 8 being furnished separately from each other. The arrangement prevents any ground potential fluctuation of the VSS 8 from affecting the ground potential of the FVSS 7. This allows the power supply controller 4 to operate in a stable manner.

The second embodiment has the power supply controller 4 supplying stable voltages to the electrodes of memory devices. This stabilizes the operation of the flash memory 31.

Although the second embodiment has the FVSS 7 acting as a grounded circuit only for the power supply controller 4, the FVSS 7 may also be used to cover circuits which do not perform switching actions liable to trigger a ground potential fluctuation. In the latter case, the FVSS 7 acts as a grounded circuit both for the power supply controller 4 and for those circuits in the controller 3 which are not liable to precipitate a ground potential fluctuation. The other circuits in the controller 3 are then addressed by the VSS 8.

Although the second embodiment is a flash memory operating from a single power supply, this does not signify that the invention is not applicable to a flash memory operating from a plurality of power supplies. Specifically, the invention may also be practiced as a flash memory wherein the ground terminal of a power supply controller is furnished separately from the ground terminal of those control circuits in a second controller which operate on the same supply voltage as the power supply controller and which are liable to precipitate a large power fluctuation.

Alternatively, the ground terminal of the power supply controller may be furnished separately from the ground terminal of the second controller, with the power supply terminal of the power supply controlled furnished again separately from the power supply terminal of the second controller.

Third Embodiment

Figure 4:
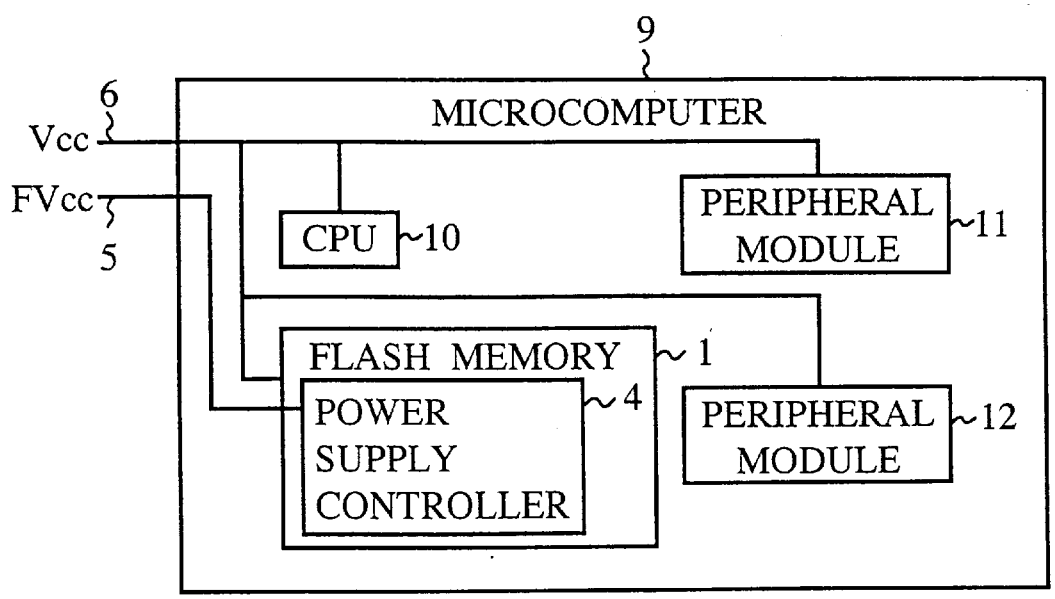
FIG. 4 is a schematic view of a microcomputer practiced as a third embodiment of the invention.

FIG. 4 is a schematic view of a microcomputer practiced as the third embodiment of the invention and comprising a flash memory operating from a single power supply. Of the reference numerals in FIG. 4, those already used in FIG. 1 showing a flash memory as the first embodiment designate like or corresponding parts, and descriptions of such parts are omitted where repetitive.

In FIG. 4, reference numeral 9 stands for a microcomputer; 10 for a central processing unit (CPU) of the microcomputer 9; 11 is a peripheral module such as a timer incorporated in the microcomputer 9; and 12 is another peripheral module including an A/D converter and a serial I/O device in the microcomputer 9. In the third embodiment, the power supply terminal of the FVCC 5 and that of the VCC 6 are also separately furnished.

The third embodiment works as follows: the microcomputer 9 is liable to have power fluctuations stemming not only from the CPU 10 but also from the operation of peripheral modules 11 and 12. In turn, the supply voltage of the power supply controller 4 in the flash memory 1 would likely be affected by such fluctuations, except that the power supply controller 4 is powered by the FVCC 5 that is furnished separately from the VCC 6 that powers the other components. This arrangement protects the supply voltage of the power supply controller 4 from power fluctuations that may come from other circuit components.

According to the third embodiment, the microcomputer 9 incorporating the flash memory 1 has the benefit of having data write, erase and verify operations performed in a more stable manner on that memory.

Although the third embodiment has the FVCC 5 fed only to the power supply controller 4, the FVCC 5 may also be used to power circuits which do not perform switching actions liable to trigger a large power fluctuation. In the latter case, the FVCC 5 acts as a power supply both to the power supply controller 4 and to those circuits in the other controller which are not liable to precipitate a power fluctuation. The other circuits in the other controller are then powered by the VCC 6.

Although the third embodiment is a microcomputer comprising a flash memory that operates from a single power supply, this is not limitative of the invention. That is, the invention may also be applied to a microcomputer including a flash memory that operates from a plurality of power supplies. More specifically, the invention may be practiced as a microcomputer having a flash memory wherein the power supply terminal of a power supply controller is furnished separately from the power supply terminal of those control circuits in a second controller which operate on the same supply voltage as the power supply controller and which are liable to precipitate a large power fluctuation.

Fourth Embodiment

Figure 5:
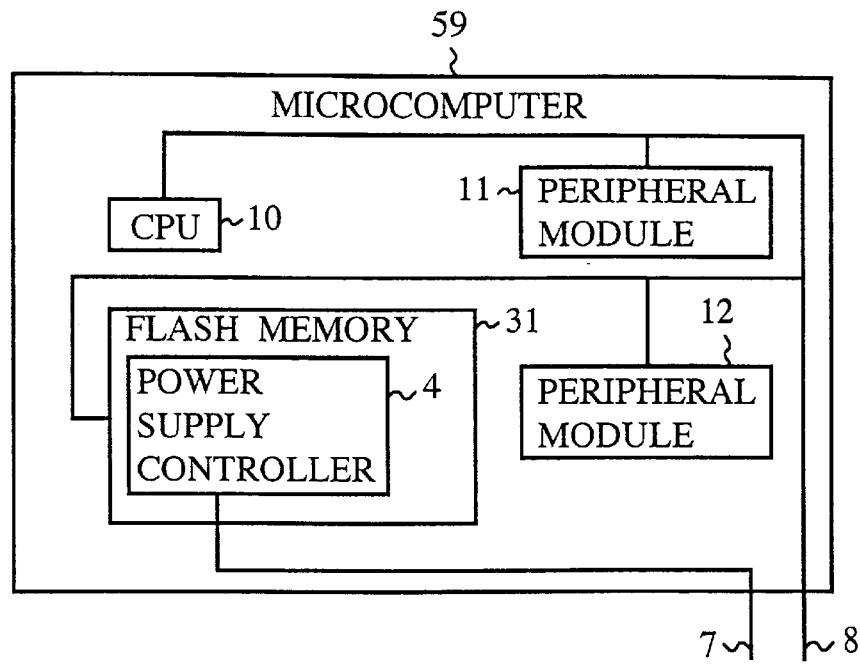
FIG. 5 is a schematic view of a microcomputer practiced as a fourth embodiment of the invention.
Figure 6:
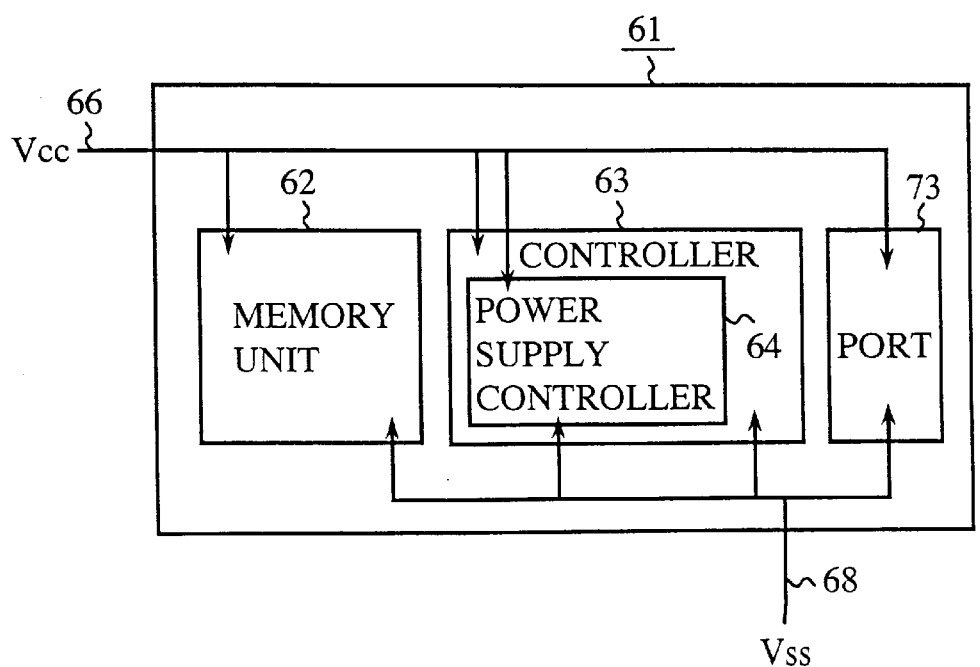
FIG. 6 is a schematic view of a conventional flash memory.

FIG. 5 is a schematic view of a microcomputer practiced as the fourth embodiment of the invention and including a flash memory operating from a single power supply. Of the reference numerals in FIG. 5, those already used in FIG. 3 showing a flash memory as the second embodiment and in FIG. 4 depicting a microcomputer as the third embodiment designate like or corresponding parts, and descriptions of such parts are omitted where repetitive.

In FIG. 5, reference numeral 59 stands for a microcomputer. In the fourth embodiment, the ground terminal of the FVSS 7 and that of the VSS 8 are also furnished separately from each other.

The fourth embodiment works as follows: the microcomputer 9 is liable to have ground potential fluctuations stemming not only from the CPU 10 but also from the peripheral modules 11 and 12 in operation. In turn, the ground potential of the power supply controller 4 in the flash memory 1 would likely be affected by such fluctuations, except that the FVSS 7 for the power supply controller 4 is furnished separately from the VSS 8 for the other components. This arrangement protects the ground potential of the power supply controller 4 from ground potential fluctuations that may come from other circuit components.

According to the fourth embodiment, the microcomputer 59 incorporating the flash memory 1 has the benefit of having data write, erase and verify operations performed in a more stable manner on that memory.

Although the fourth embodiment has the FVSS 7 covering only the power supply controller 4, the FVSS 7 may also be used to address circuits which do not perform switching actions liable to trigger a large ground potential fluctuation. In the latter case, the FVSS 7 is used as a grounded circuit both for the power supply controller 4 and for those circuits in the controller 3 which are not liable to precipitate a power fluctuation. The other circuits in the controller 3 are then addressed by the VSS 8.

Although the fourth embodiment is a microcomputer comprising a flash memory that operates from a single power supply, this does not signify that the invention is not applicable to a microcomputer including a flash memory that operates from a plurality of power supplies. Specifically, the invention may also be practiced as a microcomputer having a flash memory wherein the ground terminal of a power supply controller is furnished separately from the ground terminal of those control circuits in a second controller which operate on the same supply voltage as the power supply controller and which are liable to precipitate a large ground potential fluctuation.

Alternatively, the ground terminal of the power supply controller may be furnished separately from the ground terminal of the second controller, with the power supply terminal of the power supply controlled furnished again separately from the power supply terminal of the second controller in the flash memory inside the microcomputer.

As many apparently different embodiments of this invention may be made without departing from the spirit and scope thereof, it is to be understood that the invention is not limited to the specific embodiments thereof except as defined in the appended claims.

What is claimed is:

1. A flash memory comprising a memory unit, a power supply controller and a second controller for other control purposes, said power supply controller controlling voltages applied to said memory unit for any one of data write, erase and verify operations, said power supply controller and at least part of circuits in said second controller operating on an identical supply voltage;

wherein a power supply terminal of said power supply controller is furnished separately from a power supply terminal of those circuits in said second controller which operate on the same supply voltage as said power supply controller.

2. A flash memory comprising a memory unit, a power supply controller and a second controller for other control purposes, said power supply controller controlling voltages applied to said memory unit for any one of data write, erase and verify operations, said power supply controller and at least part of circuits in said second controller operating on an identical supply voltage;

wherein a power supply terminal of said power supply controller and of those circuits in said second controller which operate on the same supply voltage as said power supply controller and which do not perform switching actions likely to trigger a significant power fluctuation is furnished separately from a power supply terminal of those circuits in said second controller which operate on the same supply voltage as said power supply controller and which perform switching actions likely to trigger a significant power fluctuation.

3. A flash memory comprising a memory unit, a power supply controller and a second controller for other control purposes, said power supply controller controlling voltages applied to said memory unit for any one of data write, erase and verify operations, said power supply controller and at least part of circuits in said second controller operating on an identical supply voltage;

wherein a ground terminal of said power supply controller is furnished separately from a ground terminal of those circuits in said second controller which are likely to trigger a significant ground potential fluctuation.

4. A flash memory comprising a memory unit, a power supply controller and a second controller for other control purposes, said power supply controller controlling voltages applied to said memory unit for any one of data write, erase and verify operations, said power supply controller and at least part of circuits in said second controller operating on an identical supply voltage;

wherein a ground terminal of said power supply controller and of those circuits in said second controller which do not perform switching actions likely to trigger a significant ground potential fluctuation is furnished separately from a ground terminal of those circuits in said second controller which perform switching actions likely to trigger a significant ground potential fluctuation.

5. A microcomputer having a flash memory comprising a memory unit, a power supply controller and a second controller for other control purposes, said power supply controller controlling voltages applied to said memory unit for any one of data write, erase and verify operations, said power supply controller and at least part of circuits in said second controller operating on an identical supply voltage;

wherein, in said flash memory, a power supply terminal of said power supply controller is furnished separately from a power supply terminal of those circuits in said second controller which operate on the same supply voltage as said power supply controller.

6. A microcomputer having a flash memory comprising a memory unit, a power supply controller and a second controller for other control purposes, said power supply controller controlling voltages applied to said memory unit for any one of data write, erase and verify operations, said power supply controller and at least part of circuits in said second controller operating on an identical supply voltage;

wherein, in said flash memory, a power supply terminal of said power supply controller and of those circuits in said second controller which operate on the same supply voltage as said power supply controller and which do not perform switching actions likely to trigger a significant power fluctuation is furnished separately from a power supply terminal of those circuits in said second controller which operate on the same supply voltage as said power supply controller and which perform switching actions likely to trigger a significant power fluctuation.

7. A microcomputer having a flash memory comprising a memory unit, a power supply controller and a second controller for other control purposes, said power supply controller controlling voltages applied to said memory unit for any one of data write, erase and verify operations, said power supply controller and at least part of circuits in said second controller operating on an identical supply voltage;

wherein, in said flash memory, a ground terminal of said power supply controller is furnished separately from a ground terminal of those circuits in said second controller which are likely to trigger a significant ground potential fluctuation.

8. A microcomputer having a flash memory comprising a memory unit, a power supply controller and a second controller for other control purposes, said power supply controller controlling voltages applied to said memory unit for any one of data write, erase and verify operations, said power supply controller and at least part of circuits in said second controller operating on an identical supply voltage;

wherein, in said flash memory, a ground terminal of said power supply controller and of those circuits in said second controller which do not perform switching actions likely to trigger a significant ground potential fluctuation is furnished separately from a ground terminal of those circuits in said second controller which perform switching actions likely to trigger a significant ground potential fluctuation.

* * * * *